US011867814B1

(12) United States Patent
Bohannon et al.

(10) Patent No.: US 11,867,814 B1
(45) Date of Patent: Jan. 9, 2024

(54) TECHNIQUES FOR DRIVING A LASER DIODE IN A LIDAR SYSTEM

(71) Applicant: AEVA, INC., Mountain View, CA (US)

(72) Inventors: Eric Bohannon, Henrietta, NY (US); Garret Phillips, Pittsford, NY (US); Bryce Bradford, Cupertino, CA (US)

(73) Assignee: Aeva, Inc., Mountain View, CA (US)

( * ) Notice: Subject to any disclaimer, the term of this patent is extended or adjusted under 35 U.S.C. 154(b) by 0 days.

(21) Appl. No.: 18/076,198

(22) Filed: Dec. 6, 2022

(51) Int. Cl.
    | *G01S 17/58* | (2006.01) |
    | *G01S 7/499* | (2006.01) |
    | *H01C 1/016* | (2006.01) |
    | *H01C 1/16* | (2006.01) |
    | *H03B 5/12* | (2006.01) |
    | *H03C 3/09* | (2006.01) |

(52) U.S. Cl.
    CPC .............. *G01S 17/58* (2013.01); *G01S 7/499* (2013.01); *H01C 1/016* (2013.01); *H01C 1/16* (2013.01); *H03B 5/1228* (2013.01); *H03C 3/0908* (2013.01)

(58) Field of Classification Search
    CPC ......... G01S 17/58; G01S 7/499; H01C 1/016; H01C 1/16; H03B 5/1228; H03C 3/0908
    USPC ...................................................... 372/38.02
    See application file for complete search history.

(56) References Cited

U.S. PATENT DOCUMENTS

| 4,873,448 A * | 10/1989 | Shirai .................... H03K 17/18 327/521 |
| 6,574,022 B2 * | 6/2003 | Chow .................. G02B 6/4202 385/83 |
| 6,931,040 B2 * | 8/2005 | Murata ................... H01S 5/042 372/38.08 |
| 7,536,107 B2 * | 5/2009 | Paillet .................... H04B 10/66 398/140 |
| 7,825,730 B2 * | 11/2010 | Yang ..................... H03F 1/0261 330/285 |
| 8,094,692 B2 * | 1/2012 | Nakamura .............. H01S 5/042 372/29.016 |
| 9,054,485 B1 * | 6/2015 | Ng ........................ H01S 5/0427 |
| 10,224,694 B2 * | 3/2019 | Wei ..................... H01S 5/06821 |
| 10,447,402 B2 * | 10/2019 | Kim ....................... H04B 10/69 |
| 10,700,490 B2 * | 6/2020 | Soenen ................. H01S 3/0085 |
| 2013/0121356 A1 * | 5/2013 | Sugawara .............. H05B 45/10 315/172 |
| 2022/0018945 A1 * | 1/2022 | Kim ...................... G01S 7/4915 |
| 2022/0260486 A1 * | 8/2022 | Hobby .................. G01N 21/39 |

* cited by examiner

*Primary Examiner* — Vu A Vu
(74) *Attorney, Agent, or Firm* — Womble Bond Dickinson (US) LLP (57) ABSTRACT

A frequency modulated continuous wave (FMCW) light detection and ranging (LIDAR) system that includes an optical source to generate light at a target frequency. The system also includes a first transistor to transmit a modulation current through a modulation path that includes the optical source and a modulation resistor. The system also includes electro optical circuitry coupled to the first transistor to produce a phase locked loop. The system also includes a second transistor to transmit a bias current through a bias path that includes the optical source and is separate from the modulation path, wherein the bias path is separate from the modulation path.

19 Claims, 4 Drawing Sheets

TECHNIQUES FOR DRIVING A LASER DIODE IN A LIDAR SYSTEM

FIELD OF INVENTION

The present disclosure is related to light detection and ranging (LIDAR) systems.

BACKGROUND

In coherent LIDAR techniques, such as Frequency-Modulated Continuous-Wave (FMCW) LIDAR, both the distance and relative radial speed of a target can affect the mixing frequency between a local oscillator (LO) and the return signal. To sense both distance and speed, conventional LIDAR systems typically use frequency modulation signals referred to as a "down-chirp" and an "up-chirp." The down-chirp and the up-chirp can be carried within the same optical beam. Often a laser diode is used as an optical source for generating the optical beam. The laser diode generates optical energy at a wavelength that is proportional to the magnitude of the current through it. Modulating the current modulates the frequency of the optical energy and generates the chirps. The current levels used to excite the laser diode may be several hundred milliamps or even as high as an Amp or more.

The cost of the circuitry used to generate and control the optical beams can be considerable. In particular, the power handling requirements of the circuitry dictate that many of the circuit components will be higher-power discrete elements coupled to a circuit board. Simplifying the circuitry and reducing the number of higher-power components can result in significant cost savings. This is particularly true if more of the circuit components can be incorporated into an integrated circuit as opposed to discrete elements.

BRIEF DESCRIPTION OF THE DRAWINGS

For a more complete understanding of the various examples, reference is now made to the following detailed description taken in connection with the accompanying drawings in which like identifiers correspond to like elements.

DETAILED DESCRIPTION

The present disclosure describes various examples of LIDAR systems and methods for detecting distance and relative speed of objects. More specifically, the present disclosure describes improved techniques for driving a laser diode.

Many LIDAR systems use a laser diode as an optical source for generating the optical beam used to scan the target environment. To measure distance and speed simultaneously or near simultaneously, the optical beam can be frequency modulated to generate an up-chirp and down-chirp. To modulate the optical frequency, the amplitude of the current through the laser diode is modulated.

The laser diode may be driven by a bias current that causes the laser diode to emit light at a base frequency and a modulation current that causes the frequency of the emitted light to vary around the base frequency. The current levels used to excite the laser diode may be several hundred milliamps up to an Amp or even more. Typically, the bias current and the modulation current are driven by the same circuitry. The circuit components used to handle such large currents will usually be relatively large and often implemented in discrete circuit elements.

Embodiments of the present disclosure describe a laser diode control circuit that can be implemented using smaller less expensive circuit components while still maintaining the same current handling capacity. The laser diode control circuit in accordance with embodiments of the present disclosure includes a modulation drive circuit and a separate bias drive circuit. The bias drive circuit is a simple higher power circuit that draws a steady DC current through the laser diode. The modulation drive circuit is a lower power circuit that includes an electro-optical phase locked loop (EOPLL) and additional circuitry, such as an integrator, that modulates the current amplitude to generate the chirps. As will be described in greater detail herein, embodiments of the present disclosure can prevent the higher current of the bias circuit from affecting the EOPLL or the modulation circuitry. Accordingly, the EOPLL, the modulation circuitry and other circuitry for driving the modulation current through the laser diode can be designed to be small enough for implementation in the silicon of an integrated circuit to drive circuitry in a more efficient, cost effective, compact, and less power consuming manner.

In the following description, reference may be made herein to quantitative measures, values, relationships or the like. Unless otherwise stated, any one or more if not all of these may be absolute or approximate to account for acceptable variations that may occur, such as those due to engineering tolerances or the like.

Figure 1:
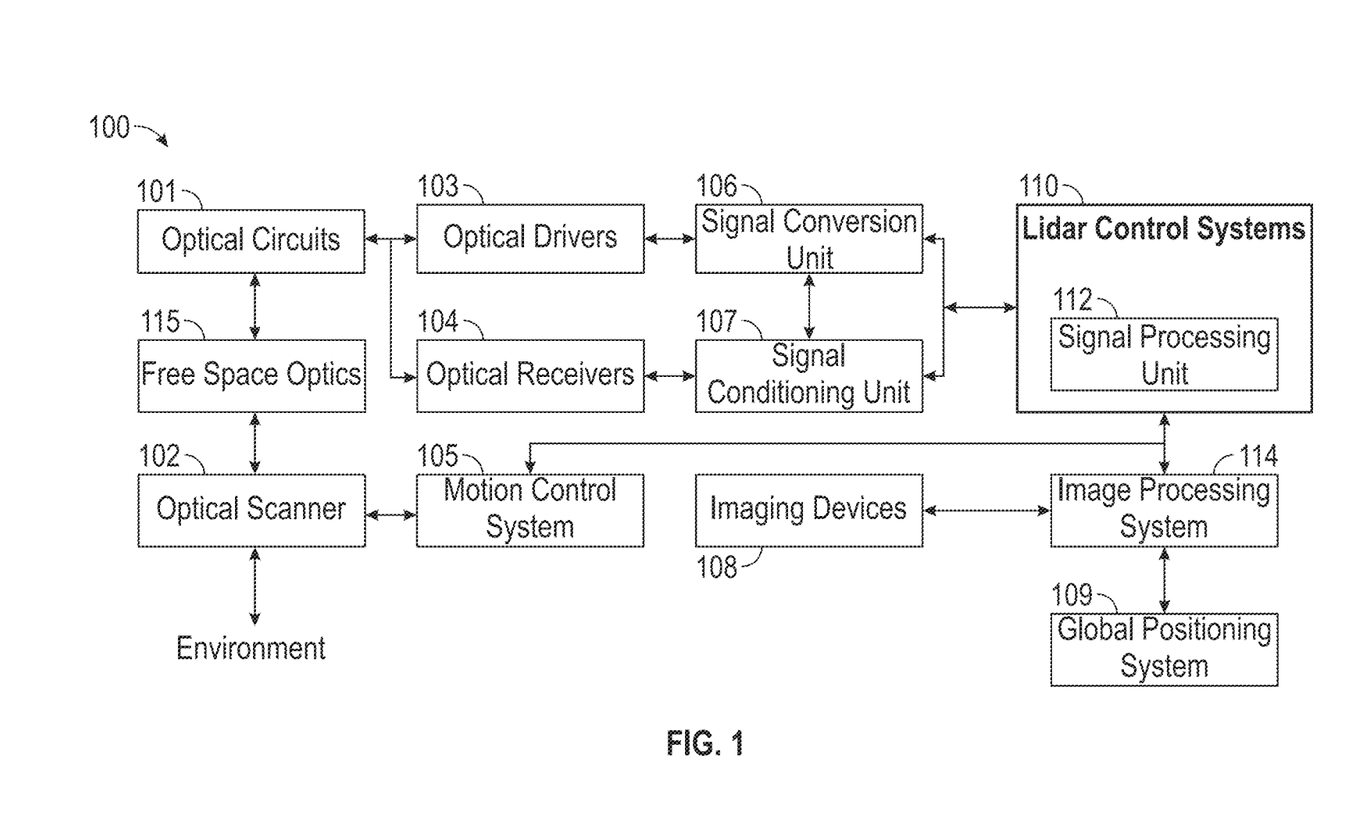
FIG. 1 is a block diagram of an example LIDAR system according to some embodiments of the present disclosure.

FIG. 1 is a block diagram of an example LIDAR system 100 according to example implementations of the present disclosure. The LIDAR system 100 includes one or more of each of a number of components but may include fewer or additional components than shown in FIG. 1. As shown, the LIDAR system 100 includes optical circuits 101 implemented on a photonics chip. The optical circuits 101 may include a combination of active optical components and passive optical components. Active optical components may generate, amplify, and/or detect optical signals and the like. In some examples, the active optical component includes optical beams at different wavelengths, and includes one or more optical amplifiers, one or more optical detectors, or the like.

Free space optics 115 may include one or more optical waveguides to carry optical signals, and route and manipulate optical signals to appropriate input/output ports of the active optical circuit. The free space optics 115 may also include one or more optical components such as taps, wavelength division multiplexers (WDM), splitters/combiners, polarization beam splitters (PBS), collimators, couplers or the like. In some examples, the free space optics 115 may include components to transform the polarization state and direct received polarized light to optical detectors using a PBS, for example. The free space optics 115 may further include a diffractive element to deflect optical beams having different frequencies at different angles along an axis (e.g., a fast axis).

In some examples, the LIDAR system 100 includes an optical scanner 102 that includes one or more scanning mirrors that are rotatable along an axis (e.g., a slow-axis) that is orthogonal or substantially orthogonal to the fast-axis of the diffractive element to steer optical signals to scan an environment according to a scanning pattern. For instance, the scanning mirrors may be rotatable by one or more galvanometers. Objects in the target environment may scatter an incident light into a return optical beam or a target return signal. The optical scanner 102 also collects the return optical beam or the target return signal, which may be returned to the passive optical circuit component of the optical circuits 101. For example, the return optical beam may be directed to an optical detector by a polarization beam splitter. In addition to the mirrors and galvanometers, the optical scanner 102 may include components such as a quarter-wave plate, lens, anti-reflective coated window or the like.

To control and support the optical circuits 101 and optical scanner 102, the LIDAR system 100 includes LIDAR control systems 110. The LIDAR control systems 110 may include a processing device for the LIDAR system 100. In some examples, the processing device may be one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. The processing device may also be one or more special-purpose processing devices such as an application specific integrated circuit (ASIC), a field programmable gate array (FPGA), a digital signal processor (DSP), network processor, or the like.

In some examples, the LIDAR control systems 110 may include a signal processing unit 112 such as a DSP. The LIDAR control systems 110 are configured to output digital control signals to control optical drivers 103. In some examples, the digital control signals may be converted to analog signals through signal conversion unit 106. For example, the signal conversion unit 106 may include a digital-to-analog converter. The optical drivers 103 may then provide drive signals to active optical components of optical circuits 101 to drive optical sources such as lasers and amplifiers. In some examples, several optical drivers 103 and signal conversion units 106 may be provided to drive multiple optical sources.

The LIDAR control systems 110 are also configured to output digital control signals for the optical scanner 102. A motion control system 105 may control the galvanometers of the optical scanner 102 based on control signals received from the LIDAR control systems 110. For example, a digital-to-analog converter may convert coordinate routing information from the LIDAR control systems 110 to signals interpretable by the galvanometers in the optical scanner 102. In some examples, a motion control system 105 may also return information to the LIDAR control systems 110 about the position or operation of components of the optical scanner 102. For example, an analog-to-digital converter may in turn convert information about the galvanometers' position to a signal interpretable by the LIDAR control systems 110.

The LIDAR control systems 110 are further configured to analyze incoming digital signals. In this regard, the LIDAR system 100 includes optical receivers 104 to measure one or more beams received by optical circuits 101. For example, a reference beam receiver may measure the amplitude of a reference beam from the active optical component, and an analog-to-digital converter converts signals from the reference receiver to signals interpretable by the LIDAR control systems 110. Target receivers measure the optical signal that carries information about the range and velocity of a target in the form of a beat frequency, modulated optical signal. The reflected beam may be mixed with a second signal from a local oscillator. The optical receivers 104 may include a high-speed analog-to-digital converter to convert signals from the target receiver to signals interpretable by the LIDAR control systems 110. In some examples, the signals from the optical receivers 104 may be subject to signal conditioning by signal conditioning unit 107 prior to receipt by the LIDAR control systems 110. For example, the signals from the optical receivers 104 may be provided to an operational amplifier for amplification of the received signals and the amplified signals may be provided to the LIDAR control systems 110.

In some applications, the LIDAR system 100 may additionally include one or more imaging devices 108 configured to capture images of the environment, a global positioning system 109 configured to provide a geographic location of the system, or other sensor inputs. The LIDAR system 100 may also include an image processing system 114. The image processing system 114 can be configured to receive the images and geographic location, and send the images and location or information related thereto to the LIDAR control systems 110 or other systems connected to the LIDAR system 100.

In operation according to some examples, the LIDAR system 100 is configured to use nondegenerate optical sources to simultaneously measure range and velocity across two dimensions. This capability allows for real-time, long range measurements of range, velocity, azimuth, and elevation of the surrounding environment.

In some examples, the scanning process begins with the optical drivers 103 and LIDAR control systems 110. The LIDAR control systems 110 instruct the optical drivers 103 to independently modulate one or more optical beams, and these modulated signals propagate through the passive optical circuit to the collimator. The collimator directs the light at the optical scanning system that scans the environment over a preprogrammed pattern defined by the motion control system 105. The optical circuits 101 may also include a polarization wave plate (PWP) to transform the polarization of the light as it leaves the optical circuits 101. In some examples, the polarization wave plate may be a quarter-wave plate or a half-wave plate. A portion of the polarized light may also be reflected back to the optical circuits 101. For example, lensing or collimating systems used in LIDAR system 100 may have natural reflective properties or a reflective coating to reflect a portion of the light back to the optical circuits 101.

Optical signals reflected back from the environment pass through the optical circuits 101 to the receivers. Because the polarization of the light has been transformed, it may be reflected by a polarization beam splitter along with the portion of polarized light that was reflected back to the optical circuits 101. Accordingly, rather than returning to the same fiber or waveguide as an optical source, the reflected light is reflected to separate optical receivers. These signals interfere with one another and generate a combined signal. Each beam signal that returns from the target produces a time-shifted waveform. The temporal phase difference between the two waveforms generates a beat frequency measured on the optical receivers (photodetectors). The combined signal can then be reflected to the optical receivers 104.

The analog signals from the optical receivers 104 are converted to digital signals using ADCs. The digital signals are then sent to the LIDAR control systems 110. A signal processing unit 112 may then receive the digital signals and interpret them. In some embodiments, the signal processing unit 112 also receives position data from the motion control system 105 and galvanometers (not shown) as well as image data from the image processing system 114. The signal processing unit 112 can then generate a 3D point cloud with information about range and velocity of points in the environment as the optical scanner 102 scans additional points. The signal processing unit 112 can also overlay a 3D point cloud data with the image data to determine velocity and distance of objects in the surrounding area. The system also processes the satellite-based navigation location data to provide a precise global location.

Figure 2:
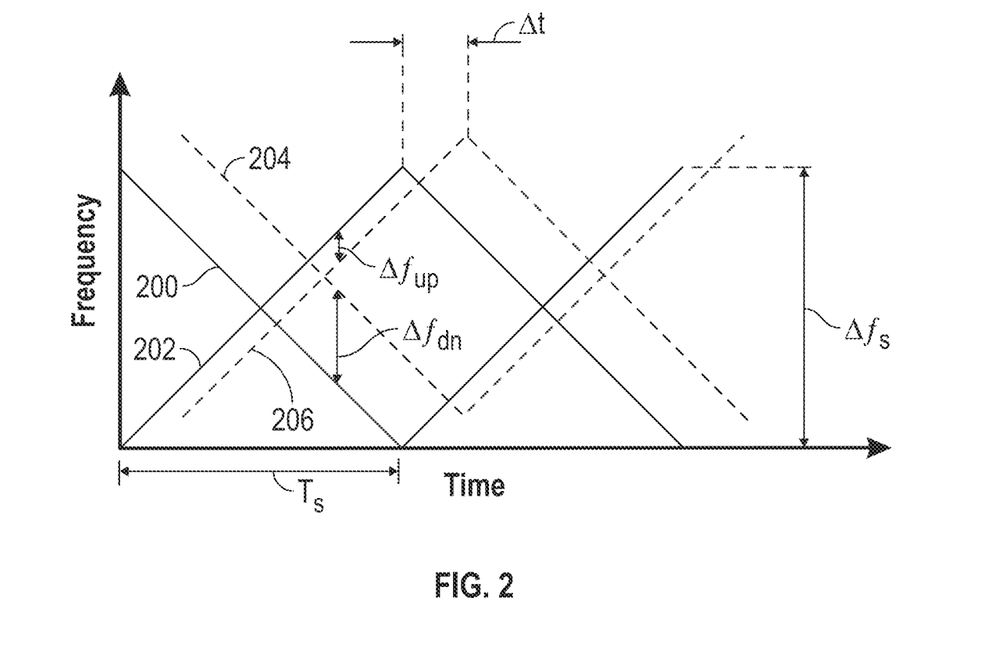
FIG. 2 is a time-frequency diagram of FMCW scanning signals that can be used by a LIDAR system according to some embodiments of the present disclosure.

FIG. 2 is a time-frequency diagram of FMCW scanning signals that can be used by a LIDAR system according to some embodiments. The FMCW scanning signals 200 and 202 may be used in any suitable LIDAR system, including the system 100, to scan a target environment. The scanning signal 200 may be a triangular waveform with an up-chirp and a down-chirp having a same bandwidth $\Delta f_s$, and period $T_s$. The other scanning signal 202 is also a triangular waveform that includes an up-chirp and a down-chirp with bandwidth $\Delta f_s$ and period $T_s$. However, the two signals are inverted versions of one another such that the up-chirp on scanning signal 200 occurs in unison with the down-chirp on scanning signal 202.

FIG. 2 also depicts example return signals 204 and 206. The return signals 204 and 206, are time-delayed versions of the scanning signals 200 and 202, where $\Delta t$ is the round trip time to and from a target illuminated by scanning signal 201. The round trip time is given as $\Delta t=2R/v$, where R is the target range and v is the velocity of the optical beam, which is the speed of light c. The target range, R, can therefore be calculated as $R=c(\Delta t/2)$.

In embodiments, the time delay $\Delta t$ is not measured directly, but is inferred based on the frequency differences between the outgoing scanning waveforms and the return signals. When the return signals 204 and 206 are optically mixed with the corresponding scanning signals, a signal referred to as a "beat frequency" is generated, which is caused by the combination of two waveforms of similar but slightly different frequencies. The beat frequency indicates the frequency difference between the outgoing scanning waveform and the return signal, which is linearly related to the time delay At by the slope of the triangular waveform.

If the return signal has been reflected from an object in motion, the frequency of the return signal will also be effected by the Doppler effect, which is shown in FIG. 2 as an upward shift of the return signals 204 and 206. Using an up-chirp and a down-chirp enables the generation of two beat frequencies, $\Delta f_{up}$ and $\Delta f_{dn}$. The beat frequencies $\Delta f_{up}$ and $\Delta f_{dn}$ are related to the frequency difference cause by the range, $\Delta f_{Range}$, and the frequency difference cause by the Doppler shift, $\Delta f_{Doppler}$, according to the following formulas:

$$\Delta f_{up} = \Delta f_{Range} - \Delta f_{Doppler} \quad (1)$$

$$\Delta f_{dn} = \Delta f_{Range} + \Delta f_{Doppler} \quad (2)$$

Thus, the beat frequencies $\Delta f_{up}$ and $\Delta f_{dn}$ can be used to differentiate between frequency shifts caused by the range and frequency shifts caused by motion of the measured object. Specifically, $\Delta f_{Doppler}$ is the difference between the $\Delta f_{up}$ and $\Delta f_{dn}$ and $\Delta f_{Range}$ is the average of $\Delta f_{up}$ and $\Delta f_{dn}$.

The range to the target and velocity of the target can be computed using the following formulas:

$$\text{Range} = \Delta f_{Range} \frac{cT_s}{2\Delta f_s} \quad (3)$$

$$\text{Velocity} = \Delta f_{Doppler} \frac{\lambda_c}{2} \quad (4)$$

In the above formulas, $\lambda_c = c/f_c$ and $f_c$ is the center frequency of the scanning signal.

The beat frequencies can be generated, for example, as an analog signal in optical receivers 104 of system 100. The beat frequency can then be digitized by an analog-to-digital converter (ADC), for example, in a signal conditioning unit such as signal conditioning unit 107 in LIDAR system 100. The digitized beat frequency signal can then be digitally processed, for example, in a signal processing unit, such as signal processing unit 112 in system 100.

In some scenarios, to ensure that the beat frequencies accurately represent the range and velocity of the object, beat frequencies can be measured at a same moment in time, as shown in FIG. 2. Otherwise, if the up-chirp beat frequency and the down-chirp beat frequencies were measured at different times, quick changes in the velocity of the object could cause inaccurate results because the Doppler effect would not be the same for both beat frequencies, meaning that equations (1) and (2) above would no longer be valid. In order to measure both beat frequencies at the same time, the up-chirp and down-chirp can be synchronized and transmitted simultaneously using two signals that are multiplexed together.

Figure 3:
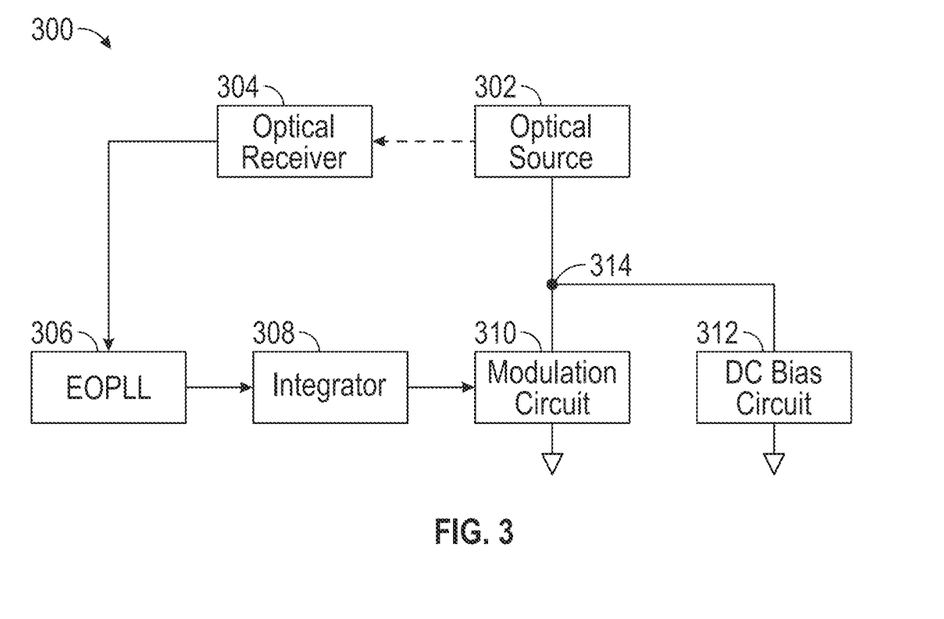
FIG. 3 illustrates an example of a laser diode control circuit for a LIDAR system according to some embodiments of the present disclosure.

FIG. 3 illustrates an example of a laser diode control circuit implemented in a LIDAR system according to some embodiments of the present disclosure. Components of the control circuit 300 may be included within the optical drivers 103 shown in FIG. 1. As shown in FIG. 3, the control circuit 300 includes an optical source 302 configured to emit laser light (e.g., one or more optical beams for performing LIDAR-based range and velocity detection, according to embodiments of the present invention. In some embodiments, the optical beam(s) may be a frequency-modulated continuous wave (FMCW) optical beam. It should be appreciated that in some scenarios, the optical beam output provided by the optical source 302 may be referred to herein as an outgoing, transmitted, or incident beam, while the beam reflected from the target may be referred to herein as the incoming, received, or return beam. The optical beam may be delivered to an optical scanner and emitted into a field of view (FOV) of the LIDAR system.

In some scenarios, a portion of the light is captured by an optical receiver 304 to generate a feedback signal for an electro optical phase locked loop (EOPLL) 306. In this fashion, the EOPLL 306 is configured to maintain the light generated by the optical source 302 at the target frequency by increasing or decreasing the drive current through the optical source responsive to the feedback signal. As will be depicted in various embodiments herein, EOPLL 306 may be implemented in various scenarios in order to achieve the advantages disclosed herein.

The control circuit 300 may also include an integrator circuit 308 in series with the EOPLL 306. The integrator circuit 308 is configured to generate the voltage signal modulations that cause the optical source to emit the chirps. An example of an integrator circuit operating within the framework of embodiments of the present disclosure is described further in relation to the embodiment depicted in FIG. 4. Together, the EOPLL and the integrator circuit generate a voltage signal that functions as input to the modulation circuit 310. As depicted in FIG. 3, the modulation circuit 310 is configured to receive a single-ended voltage signal from the integrator circuit, which causes the corresponding current to be drawn through the optical source 302 along a path that includes the optical source 302 and components of the modulation circuit 310. The DC bias circuit 312 is electrically coupled in parallel with the modulation circuit 310 such that it draws an additional bias current through the optical source 302 along a separate parallel path (i.e., parallel to the path of the modulation current) that includes t components of the DC bias circuit 312. The total current through node 314 and the optical source 302 is equal to the sum of the modulation current and the bias current.

According to some embodiments, the control circuit 300 may be implemented together in a single integrated circuit chip, as separate discrete circuit elements, or as a combination of discrete circuit elements and one or more integrated circuit chips. In some embodiments, the optical source 302 and the DC bias circuit 312 are implemented as discrete circuit components mounted, for example, to a circuit board such as printed circuit board (PCB), while the modulation circuitry, which includes the EOPLL 306 and the integrator 308, are implemented in an integrated circuit chip (e.g., silicon wafer). Other embodiments are also possible.

It will be appreciated that various alterations may be made to the system 300 and that some components may be omitted or added without departing from the scope of the disclosure. A more detailed description of an example control circuit is described further below.

Figure 4:
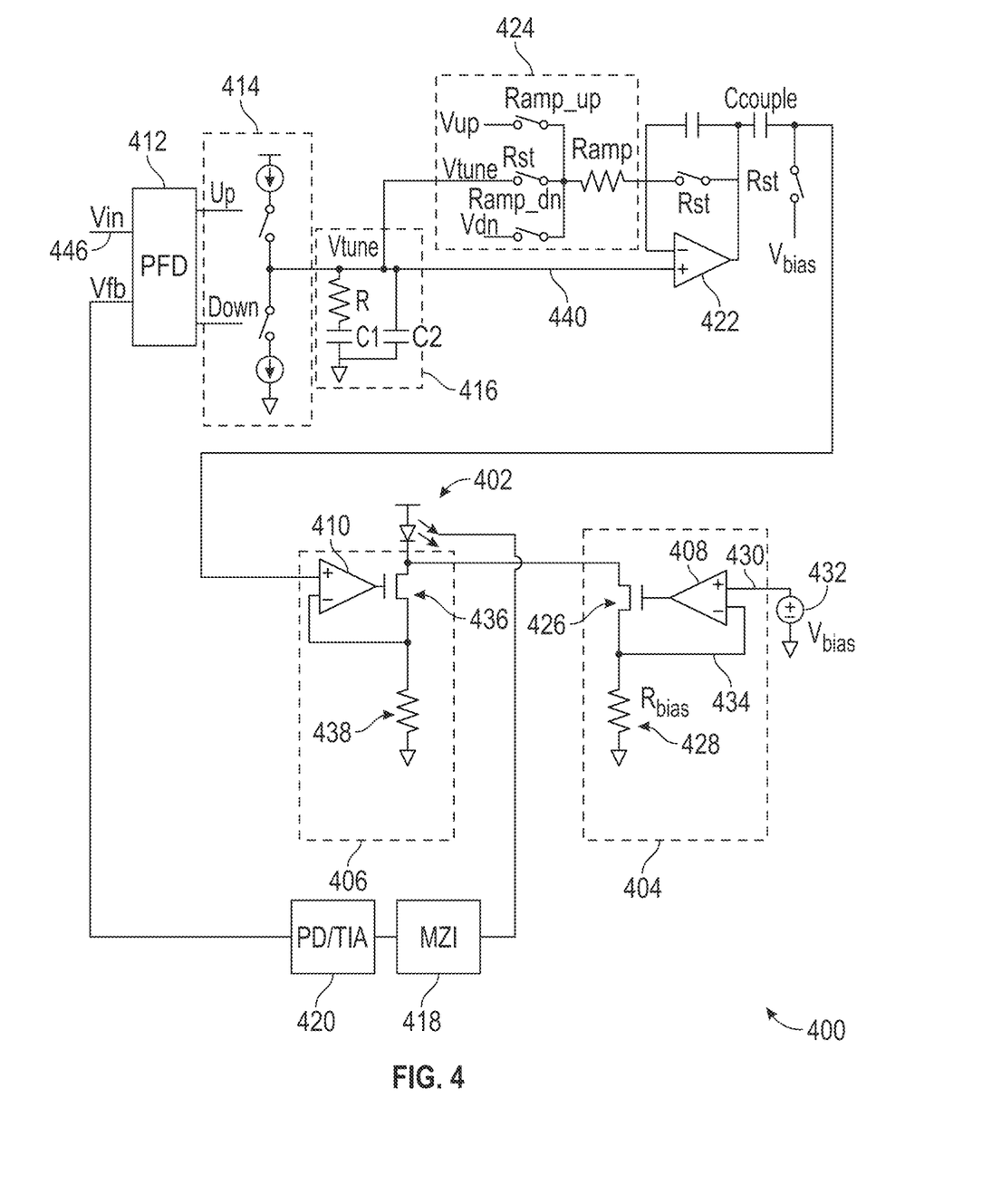
FIG. 4 illustrates another example of a laser diode control circuit for a LIDAR system according to some embodiments of the present disclosure.

FIG. 4 illustrates another example of a laser diode control circuit for a LIDAR system according to some embodiments of the present disclosure. Components of the control circuit 400 may be included within, for example, the optical drivers 103 shown in FIG. 1.

The control circuit 400 of FIG. 4 includes a laser diode 402 that includes the functionality to generate an optical output. The frequency of the optical beam produced by the laser diode 402 is proportional to the amplitude of the current that drives the laser diode 402. Different values of input current can produce different values of optical beam frequency. Thus, the optical beam frequency changes with the ramping increases and/or decreases of the current when producing the laser light chirp. In this embodiment, the laser diode 402 is driven by a bias circuit 404 which is configured to drive a constant DC current through the laser diode 402, and a modulation circuit 406 that drives a linearly increasing or decreasing current through the laser diode 402 to produce the current modulation waveform.

The bias circuit 404 includes a bias transistor 426 that draws current through a bias path that includes the optical source 402 and a bias resistor 428 in a source follower configuration with the bias transistor 426. The bias transistor 426 is controlled by an operational amplifier (OpAmp) 408, which is configured as an error amplifier. The non-inverting input 430 of the operational amplifier 408 is coupled to a DC bias voltage 432, and the inverting input 434 is coupled to the source of the bias transistor 426 between the source and the bias resistor 428. The output of the operational amplifier 408 is coupled to the gate of the bias transistor 428. With this configuration, the operational amplifier 408 controls the bias transistor 426 so that the current through the bias transistor 426 causes the same DC voltage level to exist at the source of the bias transistor 426. Accordingly, the amplitude of the bias current will be determined by the amplitude of the DC bias voltage 432 (Vbias) and the resistance of the bias resistor 428 (Rbias).

It will be appreciated that various modifications can be made to the bias drive circuit 404 described above without deviating from the scope of the claims. For example, although the bias transistor 426 is shown as a field effect transistor (FET), the transistor may be any suitable variety, including a bipolar junction transistor (BJT), and others. Additionally, the bias resistor 428 may be positioned in a source follower configuration as shown or emitter follower configuration.

The modulation circuit 406 includes a modulation transistor 436 that draws current through the laser diode 402 and is controlled by an operational amplifier (OpAmp) 410, which is configured as an error amplifier. The amplitude of the modulation current drawn through the laser diode 402 will be determined by the amplitude of the voltage at the noninverting input of the modulation OpAmp 410 and the resistance of the modulation resistor 438. The control circuit 400 generates a modulated voltage signal that is input to the modulation circuit 406 so that the current through the laser diode 402 is modulated to generate the up chirps and down chirps.

It will be appreciated that various modifications can be made to the modulation drive circuit described above without deviating from the scope of the claims. For example, although the modulation transistor 436 is shown as a field effect transistor (FET), the transistor may be any suitable variety, including a bipolar junction transistor (BJT), and others. Additionally, the modulation resistor 438 may be positioned in a source follower configuration as shown or an emitter follower configuration.

To generate the modulated voltage signal, the control circuit 400 includes circuitry to produce an electro-optical phase locked loop (EOPLL) and can include an integrator circuit. The EOPLL 306 is a feedback loop that is configured to maintain the light generated by the optical source 402 at the target frequency. The circuity used to produce the EOPLL 306 includes a phase frequency detector (PFD) 412, a charge Pump 414, a loop filter 416, and optical interferometer 418, and photodetector 420. Part of the light generated by the laser diode 402 is captured and input to the optical interferometer 418, which may be a Mach-Zehnder Interferometer (MZI), for example. The optical interferometer 418 splits the light into two different length paths, and then recombines the light into a single path. Any instantaneous difference in frequency of the two recombined light signals can be used to produce a beat frequency.

The beat frequency is detected by the photodetector 420, which in some embodiments, may be a photodiode followed by a transimpedance amplifier (PD/TIA) that converts the current signal from the photodiode into a voltage. The photodetector 420 detects the beat frequency from the combined light paths and feeds the beat frequency back to the PFD 412 as a voltage feedback signal, Vfb. The frequency of the voltage feedback signal will indicate the rate of change in the frequency of the light emitted by the laser diode 402.

The reference input, Vin 446, to the PFD 412 is an AC voltage signal whose frequency is used as a reference frequency that controls the rate of change (i.e., ramp rate) of the optical beam frequency. The PFD 412 detects the phase values of the reference and beat frequencies, and its output controls the switches of the charge pump 414 based on whether Vfb is lagging or leading Vin. If Vfb is lagging Vin, this indicates that the frequency of the optical signal output by the laser diode is too low and that the voltage driving the modulation transistor 410 is too low. Accordingly, to raise the voltage and thus the optical frequency, the "up" output of the PFD 412 is activated causing the loop filter 416 to be coupled to the positive current source and pulling the voltage, Vtune, up.

If Vfb is leading Vin this indicates that the frequency of the optical signal output by the laser diode 402 is too high and that the voltage driving the modulation transistor 410 is too high. Accordingly, to lower the voltage and thus the optical frequency, the "down" output of the PFD 412 is activated causing the loop filter 416 to be coupled to the negative current source and pulling the voltage, Vtune, down. In this way, the direction of the phase error values detected by the PFD 412 is used to control the charge pump 414 to raise or lower the voltage level of the non-inverting input of the OpAmp 422 through the loop filter 416.

The loop filter 416 operates according to a transfer function that integrates the current output from the charge pump 414 into a voltage and filters out at least some of the high frequency signal components. The loop filter 416 in this example is a circuit of one resistor and two capacitors. However, other arrangements are also possible depending on the desired transfer function. Additionally, the components of the loop filter 416 may be adjustable and controlled electronically to tune the electrical response of the loop filter 416.

The integrator includes the OpAmp 422, which is configured with a negative feedback current received through the capacitor, Cint. The integrator 422 performs the mathematical operation of integration with respect to time, which means that its output voltage is proportional to the input voltage integrated over time. Within certain operating conditions, this will result in the integrator outputting a ramp signal depending on the voltage at the inverting input. The integrator is controlled by ramp control circuitry 424, which is coupled to the inverting input of the operational amplifier 422 and configured to cause the output voltage of the operational amplifier 422 to ramp up or down in a linear or nearly linear fashion. Closing the Ramp_up switch connects the integrator to Vup and causes the voltage to increase. Closing the Ramp_dn switch connects the integrator to Vdn and causes the voltage to decrease. Closing the reset switch, RST, connects the input to Vtune, which causes the voltage to remain constant. Proper control of the ramp control switches can cause the integrator to generate a signal pattern, including a sawtooth pattern or the triangular pattern shown in FIG. 2, for example. Any suitable voltages may be used depending on the desired waveform of the chirps. In some embodiments, Vtune may be set to approximately 1.5 Volts, Vup may be 1.0 Volts, and Vdn may be 2.0 Volts. Setting the voltages so that the magnitude of Vtune is halfway between Vup and Vdn in this way can generate equal magnitude up-chirps and down-chirps. However, other configurations are possible. Additionally, the timing of the switching can also be used to determine the shape of the chirp waveforms.

The OpAmp 410 of the modulation drive circuit 406 receives the single-ended control signal from the integrator at the non-inverting input and controls the gate of the modulation transistor 436 to cause a voltage between the transistor 436 and the modulation resistor 438 to equal a voltage level of the single-ended control signal received at the non-inverting input. In some embodiments, the integrator is coupled to the modulation drive circuit 406 through a coupling capacitor, Ccouple. The coupling capacitor may be configured to filter out high frequency components of the voltage signal generated by combined EEOPL and integrator. Additionally, the coupling capacitor, Ccouple, can be used to isolate the modulation drive circuit 406 during the reset stage, allowing the reset voltage signal applied to the modulation drive circuit 406 to be set to any desired value during the reset stage. In the embodiment shown in FIG. 4, the input to the modulation drive circuit 406 is set to the voltage bias level, Vbias, during reset.

The particular values for the various circuit elements will vary depending on various design configurations for a particular implementation. In some embodiments, the bias current may be around 100 milliamps to several 100 milliamps, while the modulation current can range from less than 1 milliamp up more than half the bias current, but typically the bias current will be around 10 times greater than the modulation current. Thus, to handle the higher current, the bias transistor and bias resistor may be several times larger than the modulation transistor and the modulation resistor. In some embodiments, the bias transistor and bias resistor may be implemented as discrete components coupled to a circuit board, while the remainder of the circuit, including the modulation transistor 436 and modulation resistor 438 may be implemented in an integrated circuit chip.

Figure 5:
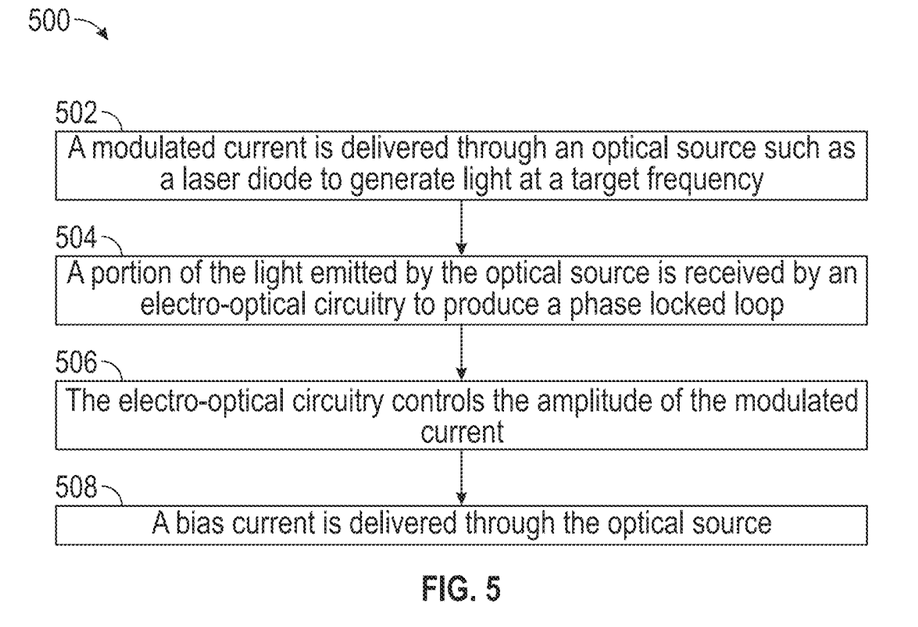
FIG. 5 is a process flow diagram of an example method for operating a frequency modulated continuous wave (FMCW) light detection and ranging (LiDAR) system according to some embodiments of the present disclosure.

FIG. 5 is a process flow diagram of an example method for operating a frequency modulated continuous wave (FMCW) light detection and ranging (LiDAR) system according to some embodiments of the present disclosure. The method 500 may be performed by any suitable LIDAR system, including the LIDAR systems 300 and 400 described above. The method may begin at block 502.

At block 502, a modulated current is delivered through an optical source such as a laser diode to generate light at a target frequency. The modulated current may be generated by a driver circuit such as the modulation drive circuit 406 of FIG. 4. The generated light may be an optical beam, a portion of which is delivered to an optical scanner for performing range and velocity detection.

At block 504, a portion of the light emitted by the optical source is received by an electro-optical circuitry to produce a phase locked loop. The electro-optical circuitry and the modulation drive circuit form a closed loop that controls a current level of the modulated current.

At block 506, the electro-optical circuitry controls the amplitude of the modulated current. For example, the EOPLL may increase the amplitude of the current if the rate of change of the optical frequency is too low, or the EOPLL may reduce the amplitude of the current if the rate of change of the optical frequency is too high.

At block 508, a bias current is delivered through the optical source. The bias current may be generated by a driver circuit such as the bias drive circuit 404 of FIG. 4, which is outside of the closed loop of the electro-optical circuitry and the modulation drive circuit. The total current through the optical source is the sum of the modulated current and the bias current. It will be appreciated that although blocks 502 and 508 are shown as separate blocks, the modulation current and the bias current will be delivered at the same time to produce a total current through the optical source that is the sum of both currents.

It will be appreciated that embodiments of the method 500 may include additional blocks not shown in FIG. 5 and that some of the blocks shown in FIG. 5 may be omitted. Additionally, the processes associated with blocks 502 through 508 may be performed in a different order than what is shown in FIG. 5.

The preceding description sets forth numerous specific details such as examples of specific systems, components, methods, and so forth, in order to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary. Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example.

Although the operations of the methods herein are shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Furthermore, the terms "first," "second," "third," "fourth," etc. as used herein are meant as labels to distinguish among different elements and may not necessarily have an ordinal meaning according to their numerical designation.

What is claimed is:

1. A frequency modulated continuous wave (FMCW) light detection and ranging (LiDAR) system, comprising:
   an optical source to generate light at a target frequency;
   a first transistor to transmit a modulation current through a modulation path that includes the optical source and a modulation resistor;
   an electro optical circuitry coupled to the first transistor to produce a phase locked loop to maintain the light generated by the optical source at the target frequency, wherein the electro optical circuitry comprises a phase-frequency detector, a charge pump, and a loop filter coupled in series to a non-inverting input of an operational amplifier configured as an integrator, and wherein the inverting input of the operational amplifier is coupled to a set of ramp selection switches; and
   a second transistor to transmit a bias current through a bias path that includes the optical source, wherein the bias path is separate from the modulation path.

2. The FMCW LiDAR system of claim 1, wherein the first transistor, the optical source, and the electro optical circuitry form a closed loop, and wherein the second transistor is external to the closed loop.

3. The FMCW LiDAR system of claim 1, wherein the second transistor comprises a Field Effect Transistor (FET) driven by the DC voltage source.

4. The FMCW LiDAR system of claim 1, wherein the bias path includes the optical source, the second transistor, and a bias resistor in a source follower or emitter follower configuration relative to the second transistor.

5. The FMCW LiDAR system of claim 4, wherein the bias resistor and the second transistor are discrete circuit elements.

6. The FMCW LiDAR system of claim 1, wherein the first transistor and the electro optical circuitry are disposed in an integrated circuit chip and the second transistor is a discrete circuit element external to the integrated circuit chip.

7. The FMCW LiDAR system of claim 1, wherein the bias current through the optical source exhibits a fixed current level that determines a nominal frequency of the light, and the modulation current through the optical source exhibits a varying current level that varies the target frequency of the light from the nominal frequency.

8. The FMCW LiDAR system of claim 1, wherein the light is a frequency-modulated continuous wave (FMCW) optical beam.

9. The FMCW LiDAR system of claim 1, comprising:
   an optical arrangement comprising lensing optics configured to emit the light as an optical beam towards a target and collect light returned from the target in a return optical beam;
   an optical element to generate a beat frequency from the return optical beam; and
   a signal processing system to determine a range and velocity of the target from the beat frequency.

10. A method of operating a frequency modulated continuous wave (FMCW) light detection and ranging (LiDAR) system, comprising:
    delivering, via a modulation drive circuit, a modulated current through a light source to generate light at a target frequency, wherein the modulation drive circuit is controlled by an operational amplifier configured as an integrator;

receiving a portion of the light into an electro-optical circuitry to produce a phase locked loop, wherein the electro-optical circuitry comprises a phase-frequency detector, a charge pump, and a loop filter that forms a closed loop with the modulation drive circuit;

providing, by the electro-optical circuitry, a control signal to a non-inverting input of the operational amplifier to control a current level of the modulated current;

controlling a set of ramp selection switches coupled to an inverting input of the operational amplifier to generate a signal pattern that modulates the modulated current; and delivering, via a bias drive circuit outside of the closed loop, a bias current through the light source, wherein a total current through the light source is a sum of the modulated current and the bias current.

11. The method of claim 10, comprising:

emitting the light as an optical beam towards a target and collecting light returned from the target in a return optical beam;

generating a beat frequency from the return optical beam; and determining a range and velocity of the target from the beat frequency.

12. The method of claim 10, wherein delivering the bias current through the light source comprises driving an error amplifier using a constant DC voltage.

13. The method of claim 10, wherein delivering the modulated current through the light source comprises varying the current level of the modulated current to vary a frequency of the light generated by the light source.

14. The method of claim 10, wherein delivering the bias current through the light source comprises delivering a fixed level of current that determines a nominal frequency of the light generated by the light source.

15. A system for driving a laser diode, comprising:

a first transistor to transmit a modulation current through a modulation path that includes an optical source and a modulation resistor in a source follower or emitter follower configuration;

an electro optical circuitry coupled to the first transistor to produce a phase locked loop to maintain the light generated by the optical source at the target frequency, wherein the electro optical circuitry comprises a phase-frequency detector, a charge pump, and a loop filter coupled in series to a non-inverting input of an operational amplifier configured as an integrator, and wherein the inverting input of the operational amplifier is coupled to a set of ramp selection switches; and a second transistor to transmit a bias current through a bias path that includes the optical source.

16. The system of claim 15, wherein the optical source and the electro-optical circuitry form a closed loop, and wherein the second transistor is external to the closed loop.

17. The system of claim 15, wherein the first transistor is disposed within an integrated circuit chip, and the second transistor is a discrete circuit element external to the integrated circuit chip.

18. The system of claim 15, wherein the second transistor is a Field Effect Transistor driven by a DC voltage.

19. The system of claim 15, wherein the bias path includes the optical source the second transistor and a bias resistor in a source follower or emitter follower configuration relative to the second transistor.

* * * * *